United States Patent [19]

Kusano

[11] Patent Number: 5,192,884
[45] Date of Patent: Mar. 9, 1993

[54] ACTIVE FILTER HAVING REDUCED CAPACITOR AREA BUT MAINTAINING FILTER CHARACTERISTICS

[75] Inventor: Takahiro Kusano, Saitama, Japan
[73] Assignee: Kabushiki Kaisha Toshiba, Japan
[21] Appl. No.: 597,043
[22] Filed: Oct. 15, 1990

[30] Foreign Application Priority Data

Nov. 30, 1989 [JP] Japan ................... 1-312617

[51] Int. Cl.⁵ ................... H03K 5/00; H04B 1/10
[52] U.S. Cl. ................... 307/520; 328/167; 330/107
[58] Field of Search ............. 307/520; 333/167, 168, 333/172; 330/107, 109, 303, 302; 328/167, 127, 128

[56] References Cited

U.S. PATENT DOCUMENTS

| | | | |
|---|---|---|---|
| 3,786,363 | 1/1974 | Lelie | 330/109 X |
| 4,521,702 | 6/1985 | Kleinberg | 307/520 |
| 4,594,648 | 6/1986 | Gallios | 328/167 |
| 4,734,596 | 3/1988 | Campbell et al. | 328/167 X |
| 4,779,056 | 10/1988 | Moore et al. | 330/107 |
| 4,839,542 | 6/1989 | Robinson | 307/520 |
| 4,841,179 | 6/1989 | Hagino et al. | 307/520 |

OTHER PUBLICATIONS

Electronic Design, "Use Transconductance Amplifiers to Make Programmable Active Filters", #19, pp. 98–101 Sep. 13, 1976.
IBM Technical Disclosure Bulletin, "High Performance Cosmic Filter with Digital K Selection", vol. 32, No. 12, May 1990 pp. 329–332.
Elektor, "The 13600, a new OTA", vol. 8, No. 4, pp. 4-50-4-51, Apr. (1982).
Proceedings of the 1987 Bipolar Circuits and Technology Meeting, IEEE, "Single:Chip Y/C Signal-Processing LSI for 8 mm VCR System", Yamaguchi et al., pp. 139-141, Sep. 21-22, 1987.
Cambridge University Press, "The Art of Electronics", Horowitz et al., p. 7. (1980).

Primary Examiner—Stanley D. Miller
Assistant Examiner—Toan Tran
Attorney, Agent, or Firm—Banner, Birch, McKie & Beckett

[57] ABSTRACT

An active filter comprises a differential-type voltage-controlled current source. A first resistor is connected between the first input terminal of the voltage-controlled current source and a first signal source. A second resistor is connected between the second input terminal of the voltage-controlled current source and the second signal source (or the output terminal of the voltage-controlled current source). The incremental transfer conductance gm of the filter becomes smaller by $R_2/(R_1+R_2)$ compared to that of an active filter which does not contain the first and the second resistors of the active filter of the invention, where $R_1$ and $R_2$ are resistance values of the first and the second resistors, respectively.

6 Claims, 2 Drawing Sheets

ACTIVE FILTER HAVING REDUCED CAPACITOR AREA BUT MAINTAINING FILTER CHARACTERISTICS

BACKGROUND OF THE INVENTION

1. Field of the Invention

This invention relates to an active filter, and more particularly to an active filter formed in an integrated circuit.

2. Description of the Related Art

When forming filters in an integrated circuit, active filters which utilize feedback technique are often formed because of difficulty in constructing an inductance in the integrated circuit. A basic block of an active filter has a gain block (hereinafter called a voltage-controlled current source) which amplifies according to an incremental transfer conductance, an integrating capacitor which is a in determining the coefficient of the filter, and an impedance transfer circuit (buffer) comprising for example resistors.

FIGS. 1 and 2 show basic blocks of filters formed in integrated circuits. FIG. 1 shows a circuit including a differential circuit-type voltage-controlled current source 10 and an integrating capacitor 12. FIG. 2 shows a circuit including a feedback loop formed by a buffer amplifier 14 added to the circuit shown in FIG. 1. In FIG. 1, if the voltages at the non-inverting input and the inverting input of the voltage-controlled current source 10 equal $V_1$ and $V_2$, respectively, and the voltage at the capacitor 12 equals $V_3$, the output voltage Y of the circuit in FIG. 1 is as follows.

$$Y = V_3 + \frac{gm}{SC} \times (V_1 - V_2) \quad (1)$$

wherein gm is an incremental transfer conductance of the voltage-controlled current source 10, C is a capacitance of the capacitor 12 and S is an angular frequency.

In the equation (1), gm/C determines the coefficient of the filter. If a desired coefficient of the filter is A (a constant value), the capacitance C needed in the integrated circuit is as follows.

$$C = \frac{gm}{A} \quad (2)$$

It is understood that filters with different characteristics may be formed in the intergrated circuit if the capacitance C is adequately changed.

The capacitance C is controlled by the area used in forming the capacitor in the integrated circuit. In general, the capacitor occupies a larger area than other devices. The value of the capacitance realized in the integrated circuit has an upper limit because the area occupied by the capacitor becomes large as the capacitance increases. Thus, the filter coefficient realized in the integrated circuit also has a limit.

SUMMARY OF THE INVENTION

Accordingly, it is an object of the present invention to provide an improved active filter which can be designed over a wider range of filter characteristics without increasing the capacitor area. In accordance with the present invention, the foregoing object is achieved by providing an active filter, which comprises a differential circuit voltage-controlled current source including first and second input terminals, an output terminal, a first signal source, a first resistor connected between the first signal source and the first input terminal of the voltage-controlled current source, a second resistor connected between the first and the second input terminals of the voltage-controlled current source, and a second signal source connected to the second input terminal of the voltage-controlled current source.

In accordance with another aspect of the present invention, the above-stated object is achieved by providing an active filter, which comprises a differential circuit voltage-controlled current source including a first and a second input terminals, an output terminal, a first signal source connected to the first input terminal of the volrage-controlled current source, a first resistor connected between the output and the second terminal of the voltage-controlled current source, a second resistor connected between the first and the second input terminal of the voltage-controlled current source, a second signal source, and a capacitor connected between the second signal source and the output terminal of the voltage-controlled current source.

Other objects, features, and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

A more complete appreciation of the present invention and many of its attendant advantages will be readily understood by reference to the following detailed description considered in connection with the accompanying drawings, in which.

DETAILED DESCRIPTION OF THE PREFERRED EMBODIMENTS

Figure 1:
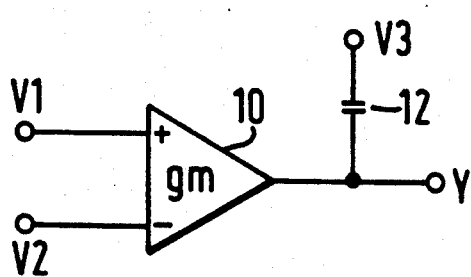
FIGS. 1 and 2 provide a circuit diagram, respectively, of an active filter according to the related art.
Figure 2:
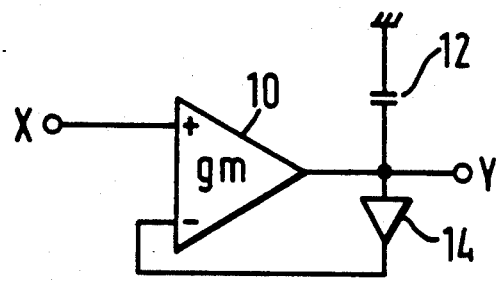

The preferred embodiment of the present invention will now be described in more detail with reference to the accompanying drawings. Where, in the drawings, the same numerals are applied to similar elements, the detailed descriptions thereof are not repeated.

Figure 3:
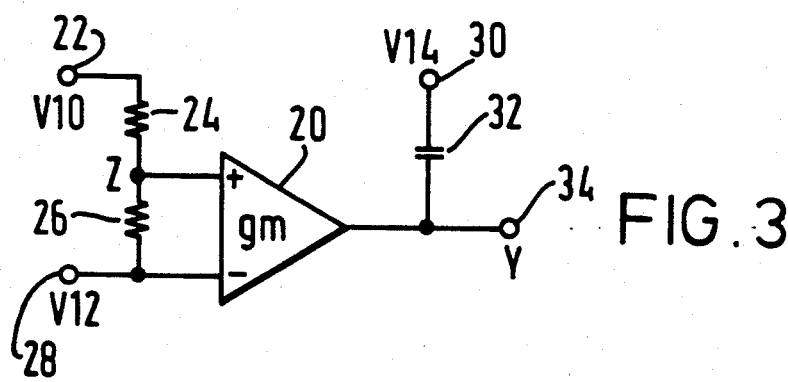
FIGS. 3 through 6 provide a circuit diagram, respectively, of an active filter according to the present invention.

FIG. 3 is a circuit diagram of an active filter of one embodiment of the invention.

A voltage-controlled current source 20 is of differential circuit-type. The non-inverting input of the voltage-controlled current source 20 is connected to a first signal source 22 through a resistor 24. A resistor 26 is connected between the non-inverting input and the inverting input of the voltage-controlled current source 20. The inverting input of the voltage-controlled current source 20 is connected to a second signal source 28. The output terminal of the voltage-controlled current source 20 is connected to a third signal source 30 through an integrating capacitor 32. An output terminal 34 is connected to the output terminal of the voltage-controlled current source 20.

The voltage at the non-inverting input of the voltage-controlled current source 20 is as follows.

$$Z = \frac{R_2 \cdot V_{10} + R_1 \cdot V_{12}}{R_1 + R_2} \quad (3)$$

wherein $R_1$ and $R_2$ are the resistance value of the resistors 24 and 26, respectively. $V_{10}$ and $V_{12}$ are the voltages of the first and the second signal source 22, 28, respectively.

The voltage at the output terminal 34 is as follows.

$$\begin{aligned} Y &= V_{14} + \frac{1}{SC} \times gm \times (Z - V_{12}) \\ &= V_{14} + \frac{gm}{SC} \times \left( \frac{R_2 \cdot V_{10} + R_1 \cdot V_{12}}{R_1 + R_2} - V_{12} \right) \\ &= V_{14} + \frac{gm}{SC} \times (V_{10} - V_{12}) \times \frac{R_2}{R_1 + R_2} \end{aligned} \quad (4)$$

As compared with the equation (1), the equation (4) shows that the incremental transfer conductance gm of the filter in FIG. 3 becomes smaller by $R_2/(R_1+R_2)$ (<1) times than that of the filter shown in FIG. 1. That is, the same filter characteristic as that of the related art is realized with a capacitor area multiplied $R_2/(R_1+R_2)$.

Figure 4:
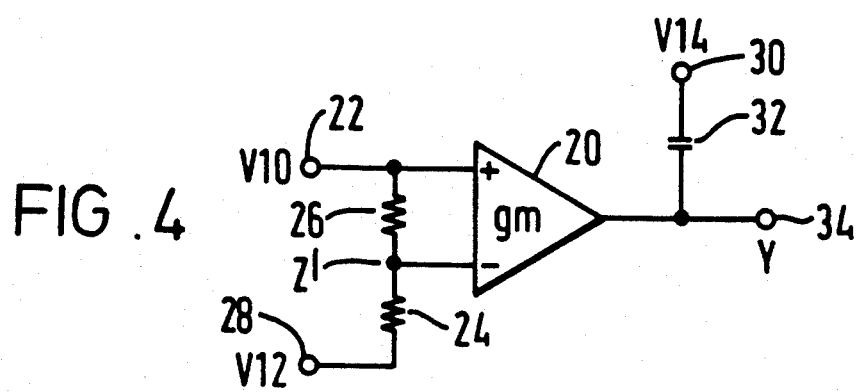

FIG. 4 is a circuit diagram of an active filter of second embodiment of the invention.

In this embodiment, the first signal source 22 is connected directly to the non-inverting input of the voltage-controlled current source 20. The second signal source 28 is connected to the inverting input of the voltage-controlled current source 20 through the resistor 24.

A voltage at the inverting input of the voltage-controlled current source 20 is as follows.

$$Z' = \frac{R_1 \cdot V_{10} + R_2 \cdot V_{12}}{R_1 + R_2} \quad (5)$$

The voltage at the output terminal 34 is as follows.

$$\begin{aligned} Y &= V_{14} + \frac{1}{SC} \times gm \times (V_{10} - Z') \\ &= V_{14} + \frac{gm}{SC} \times \left( V_{10} - \frac{R_1 \cdot V_{10} + R_2 \cdot V_{12}}{R_1 + R_2} \right) \\ &= V_{14} + \frac{gm}{SC} \times (V_{10} - V_{12}) \times \frac{R_2}{R_1 + R_2} \end{aligned} \quad (6)$$

The equation (6) is the same as the equation (4), and thus the same advantages are realized with this embodiment.

Figure 5:
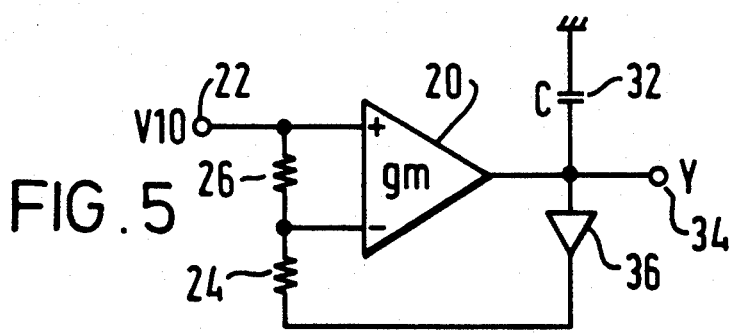

FIG. 5 is a circuit diagram of an active filter of third embodiment of the invention.

In this embodiment, a feedback loop is added to the circuit shown in FIG. 4. That is, the inverting input of the voltage-controlled current source 20 has a feedback signal as an input signal in place of the signal from the second signal source 28. A buffer amplifier 36 is connected to the output terminal 34. The output terminal of the amplifier 36 is connected to the inverting input of the voltage-controlled current source 20 through the resistor 24. An alternating reference current (not shown) is supplied to the integrating capacitor 32 by the third signal source.

In this embodiment, the incremental transfer conductance of the voltage-controlled current source 20 is also smaller than that of the filter shown in FIG. 1. Thus, the area of the capacitor can be reduced. In this case, if $V_{12}$ and $V_{14}$ equal Y and zero, respectively, in the equation (6), the following equation is obtained:

$$Y = \frac{gm}{SC} \times (V_{10} - Y) \times \alpha \quad (7)$$

$$\alpha = \frac{R_2}{R_1 + R_2} < 1$$

From the equation (7), the transfer function of the circuit shown in FIG. 5 is as follows.

$$\frac{Y}{V_{10}} = \frac{\alpha \frac{gm}{C}}{S + \alpha \frac{gm}{C}} \quad (8)$$

The above equation has a characteristic of a primary low-pass filter.

Figure 6:
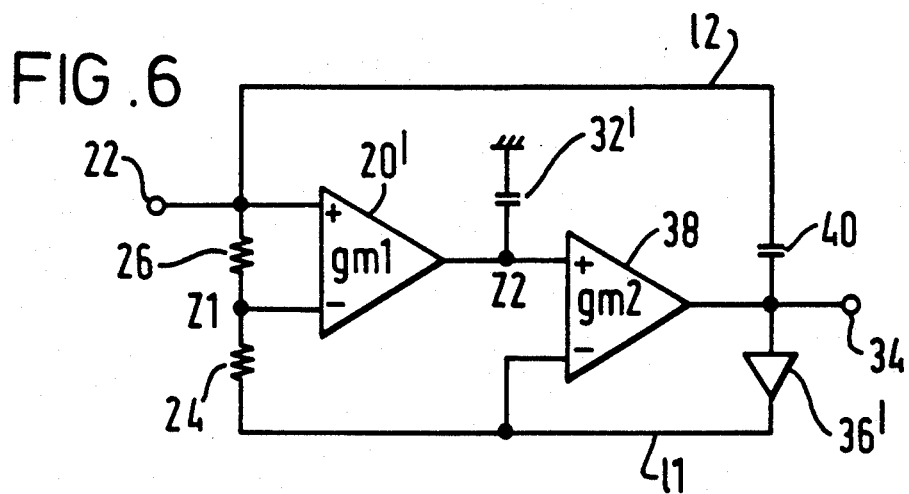

FIG. 6 is a circuit-diagram of an active filter of fourth embodiment of the invention. This circuit forms a secondary low-pass filter including two differential circuit-type of voltage-controlled current sources. An output terminal of first differential circuit type of voltage-controlled current source 20' is connected to a capacitor 32', and a non-inverting input of a second differential circuit type of voltage-controlled current source 38. The inverting input of this voltage-controlled current source 38 is connected to the resistor 24. The output terminal of the voltage-controlled current source 38 is connected to the output terminal 34, an integrating capacitor 40 and a buffer amplifier 36'. The output terminal of the amplifier 36' is connected to the resistor 24. The output of the amplifier 36' is supplied to the inverting inputs of the voltage-controlled current source 20' through the resistor 24 and directly to the voltage-controlled current source 38 as a feedback input through a feedback route $l_1$. The output terminal 34 and the input terminal 22 are connected through a feedback route $l_2$ includes the capacitor 40.

In this embodiment, the value of the incremental transfer conductance of the first voltage-controlled current source 20' becomes small according to the value of the resistors 24 and 26. The capacitance of the capacitor 32' may be made small enough to realize the same filter characteristics as that of prior secondary low-pass filters using two voltage-controlled current sources.

The invention may be adapted to high order filters as well as primary filters as mentioned above. Additionally, high order filters under the invention are, for example, realized by connecting the circuits shown in FIGS. 5 and 6 serially.

Figure 7:
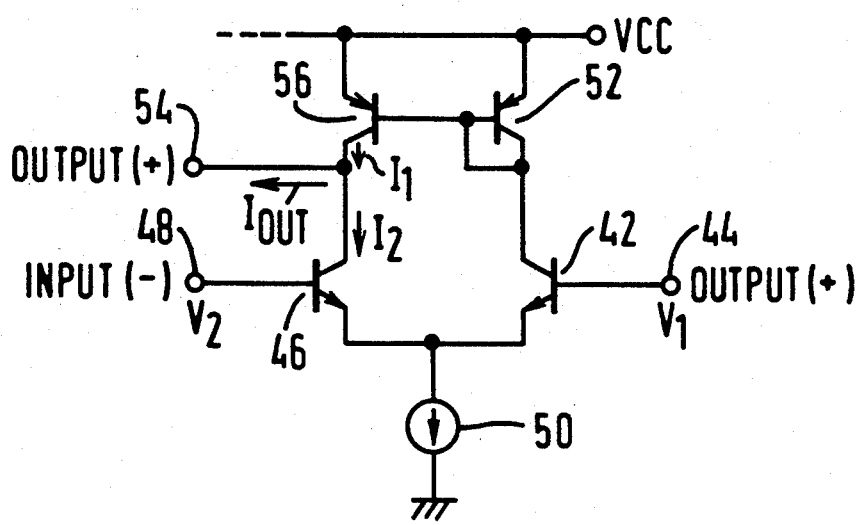
FIG. 7 provides a circuit diagram of one example of the voltage-controlled current sources shown in FIGS. 3 through 6.

The voltage-controlled current sources in FIGS. 3 through 6 are realized by a circuit such as shown in FIG. 7. That is, a base of a transistor 42 is connected to an input terminal (a non-inverting input) 44. A base of a transistor 46 is connected to an input terminal (an inverting input) 48. The emitters of the transistors 42, 46 are connected to a constant current source 50. The transistors 42 and 46 form a differential circuit. The collector of the transistor 42 is connected to a transistor 52 which operates as a diode. The collector of the transistor 46 is connected to an output terminal 54 and the collector of a transistor 56. The base of the transistor 56 is connected to the base of the transistor 52. The transistors 52 and 56 form a current mirror circuit.

The operation of the circuit shown in FIG. 7 is described below.

For example, when the voltage at the base of the transistor 42 increases, the collector current of the transistors 42 increase while the collector current of transistor 46 decreases. The collector current of the transistor 52 equals the collector current of the transistor 56. Thus, when the voltage $V_1$ at the input terminal 44 increases (the voltage $V_2$ at the input terminal 48 are supposed to be constant or decrease), the collector current of transistor 56 the collector current $I_2$ of transistor 46 increases and decreases. The difference between the values of the collector currents of the transistors 56 and 46 equals the value of the current from the output terminal 54. The output current $I_{OUT}$ from the output terminal 54 is as follows.

$$I_{OUT} = I_1 - I_2 = gm \times (V_1 - V_2).$$

That is, the output current $I_{OUT}$ of the circuit shown in FIG. 7 is controlled by the input voltages $V_1$ and $V_2$.

Modifications and variations of the present invention are possible in light of the above teachings. It is therefore to be understood that, within the scope of the appended claims, the present invention can be practiced in a manner other than as specifically described herein.

What is claimed is:

1. An active filter in an integrated circuit comprising:
   a differential circuit voltage-controlled current source including a first and a second input terminal and an output terminal, said first input terminal being connected to a first signal source for supplying a signal to be filtered by the active filter;
   a first resistor connected between the output terminal and the second input terminal of the voltage controlled current source;
   a second resistor connected between the first input terminal and the second input terminal of the voltage-controlled current source; and
   a capacitor connected between a second signal source and the output terminal of the voltage controlled current source.

2. An active filter in an integrated circuit as claimed in claim 1, wherein the second signal source has a voltage of ground.

3. An active filter in an integrated circuit as claimed in claim 1, wherein the first and the second input terminals of the voltage-controlled current source are a noninverting input and an inverting input, respectively.

4. An active filter in an integrated circuit as claimed in claim 1, further comprising a buffer amplifier connected between the output terminal of the voltage-controlled current source and the first resistor.

5. An active filter comprising:
   a first differential circuit voltage-controlled current source including a first and a second input terminal and an output terminal;
   a first signal source connected to the first input terminal of the first voltage-controlled current source;
   a second differential circuit voltage-controlled current source including a first input terminal connected to the output terminal of the first voltage-controlled current source, a second input terminal, and an output terminal connected to the second input terminal of the second voltage controlled current source;
   a first resistor connected between the output terminal of the second voltage-controlled current source and the second input terminal of the first voltage-controlled current source;
   a second resistor connected between the first and the second input terminals of the first voltage-controlled current source;
   a second signal source;
   a first capacitor connected between the second signal source and the output terminal of the first voltage-controlled current source; and
   a second capacitor connected between the output terminal of the second voltage-controlled current source and the first input terminal of the first voltage-controlled current source.

6. An active filter comprising:
   a first differential circuit voltage-controlled current source including a first and a second input terminal and an output terminal;
   a first signal source connected to the first input terminal of the first voltage-controlled current source;
   a second differential circuit voltage-controlled current source including a first input terminal connected to the output terminal of the first voltage-controlled current source, a second input terminal, and an output terminal;
   a first resistor having a first terminal connected to the second input terminal of the first voltage-controlled current source;
   a second resistor connected to the first and the second input terminals of the first voltage-controlled current source;
   a second signal source;
   a first capacitor connected between the second signal source and the output terminal of the first voltage-controlled current source;
   a second capacitor connected between the output terminal of the second voltage-controlled current source and the first input terminal of the first voltage-controlled current source; and
   a buffer amplifier having an input connected to the output terminal of the second voltage-controlled current source and having an output connected to a second terminal of the first resistor and to the second input terminal of the second voltage-controlled current source.

* * * * *